US009806608B2

(12) United States Patent
Yao et al.

(10) Patent No.: US 9,806,608 B2
(45) Date of Patent: Oct. 31, 2017

(54) CHARGE PUMP HAVING AC AND DC OUTPUTS FOR TOUCH PANEL BOOTSTRAPPING AND SUBSTRATE BIASING

(71) Applicant: Apple Inc., Cupertino, CA (US)

(72) Inventors: Weijun Yao, San Jose, CA (US); David A. Stronks, San Jose, CA (US); Hopil Bae, Sunnyvale, CA (US); Kingsuk Brahma, San Francisco, CA (US); Wei Hsin Yao, Palo Alto, CA (US); Yafei Bi, Palo Alto, CA (US); Yingxuan Li, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 42 days.

(21) Appl. No.: 15/043,405

(22) Filed: Feb. 12, 2016

(65) Prior Publication Data

US 2016/0241139 A1 Aug. 18, 2016

Related U.S. Application Data

(60) Provisional application No. 62/116,178, filed on Feb. 13, 2015.

(51) Int. Cl.
*G06F 3/044* (2006.01)
*H02M 3/07* (2006.01)
(Continued)

(52) U.S. Cl.
CPC ............ *H02M 3/07* (2013.01); *G06F 1/3262* (2013.01); *G06F 3/041* (2013.01); *G06F 3/044* (2013.01);
(Continued)

(58) Field of Classification Search
CPC ...... G06F 3/041; G06F 3/0412; G06F 3/0416; G06F 3/044; G06F 3/045; G06F 1/3262;
(Continued)

(56) References Cited

U.S. PATENT DOCUMENTS 5,483,261 A 1/1996 Yasutake
5,488,204 A 1/1996 Mead et al.
(Continued)

FOREIGN PATENT DOCUMENTS

JP 2000-163031 A 6/2000
JP 2002-342033 A 11/2002
WO WO-2011-034176 A1 2/2011

OTHER PUBLICATIONS

International Search Report dated Jul. 14, 2016, for PCT Application No. PCT/US2016/017887, filed Feb. 12, 2016, four pages.
(Continued)

*Primary Examiner* — Joe H Cheng
(74) *Attorney, Agent, or Firm* — Morrison and Foerster LLP

(57) ABSTRACT

A charge pump that can be configured to operate in a first mode and a second mode is disclosed. The charge pump can comprise a charging capacitor coupled to a first node and configured to transfer a first DC voltage to the first node. The charge pump can also comprise a first output node and a second output node coupled to the first node. During the first mode, the first output node can be configured to output a second DC voltage based on the first DC voltage, and the second output node can be configured to output a third DC voltage based on the first DC voltage. During the second mode, the first output node can be configured to output the second DC voltage, and the second output node can be configured to output an AC voltage, the AC voltage being offset by the third DC voltage.

25 Claims, 8 Drawing Sheets

(51) Int. Cl.
*G06F 3/041* (2006.01)
*G06F 1/32* (2006.01)
*H01L 23/64* (2006.01)

(52) U.S. Cl.
CPC .......... *G06F 3/0412* (2013.01); *G06F 3/0416* (2013.01); *H01L 23/642* (2013.01)

(58) Field of Classification Search
CPC . G06F 1/3296; H01L 23/642; H01L 27/0222; H02M 3/07
See application file for complete search history.

(56) References Cited

U.S. PATENT DOCUMENTS

| | | | |
|---|---|---|---|
| 5,825,352 | A | 10/1998 | Bisset et al. |
| 5,835,079 | A | 11/1998 | Shieh |
| 5,880,411 | A | 3/1999 | Gillespie et al. |
| 6,188,391 | B1 | 2/2001 | Seely et al. |
| 6,310,610 | B1 | 10/2001 | Beaton et al. |
| 6,323,846 | B1 | 11/2001 | Westerman et al. |
| 6,690,387 | B2 | 2/2004 | Zimmerman et al. |
| 7,015,894 | B2 | 3/2006 | Morohoshi |
| 7,184,064 | B2 | 2/2007 | Zimmerman et al. |
| 7,663,607 | B2 | 2/2010 | Hotelling et al. |
| 8,479,122 | B2 | 7/2013 | Hotelling et al. |
| 8,558,821 | B2 | 10/2013 | Yu et al. |
| 2006/0197753 | A1 | 9/2006 | Hotelling |
| 2009/0009098 | A1* | 1/2009 | Nukisato ............ H05B 41/2828 315/223 |
| 2009/0066408 | A1* | 3/2009 | Fujiwara ................. H02M 3/07 327/536 |
| 2009/0145631 | A1* | 6/2009 | Gabara ................. B01L 3/5027 174/254 |
| 2009/0174686 | A1* | 7/2009 | Jeon ...................... G06F 3/0416 345/174 |
| 2011/0007061 | A1 | 1/2011 | Ochiai et al. |
| 2013/0321248 | A1 | 12/2013 | Kimura |
| 2014/0321599 | A1 | 10/2014 | Cho et al. |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI ' 92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

CHARGE PUMP HAVING AC AND DC OUTPUTS FOR TOUCH PANEL BOOTSTRAPPING AND SUBSTRATE BIASING

CROSS-REFERENCE TO RELATED APPLICATIONS

This application claims priority to U.S. Provisional Application No. 62/116,178, filed Feb. 13, 2015, which is hereby incorporated by reference in its entirety for all purposes.

FIELD OF THE DISCLOSURE

This relates generally to touch sensor panels, and more particularly, to a charge pump for a touch sensor panel or touch screen that has AC and DC outputs that can be used for bootstrapping the touch sensor panel or touch screen, and biasing a driver IC substrate.

BACKGROUND OF THE DISCLOSURE

Many types of input devices are presently available for performing operations in a computing system, such as buttons or keys, mice, trackballs, joysticks, touch sensor panels, touch screens and the like. Touch screens, in particular, are becoming increasingly popular because of their ease and versatility of operation as well as their declining price. Touch screens can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. Touch screens can allow a user to perform various functions by touching the touch sensor panel using a finger, stylus or other object at a location often dictated by a user interface (UI) being displayed by the display device. In general, touch screens can recognize a touch and the position of the touch on the touch sensor panel, and the computing system can then interpret the touch in accordance with the display appearing at the time of the touch, and thereafter can perform one or more actions based on the touch. In the case of some touch sensing systems, a physical touch on the display is not needed to detect a touch. For example, in some capacitive-type touch sensing systems, fringing electrical fields used to detect touch can extend beyond the surface of the display, and objects approaching near the surface may be detected near the surface without actually touching the surface.

Capacitive touch sensor panels can be formed by a matrix of substantially transparent or non-transparent conductive plates made of materials such as Indium Tin Oxide (ITO). It is due in part to their substantial transparency that capacitive touch sensor panels can be overlaid on a display to form a touch screen, as described above. Some touch screens can be formed by at least partially integrating touch sensing circuitry into a display pixel stackup (i.e., the stacked material layers forming the display pixels).

SUMMARY OF THE DISCLOSURE

Some capacitive touch sensor panels can be formed by a matrix of substantially transparent or non-transparent conductive plates made of materials such as Indium Tin Oxide (ITO), and some touch screens can be formed by at least partially integrating touch sensing circuitry into a display pixel stackup (i.e., the stacked material layers forming the display pixels). In some examples, one or more components (e.g., a gate line) of the display pixel stackups can be biased by a charge pump on a driver integrated circuit (IC). The charge pump can also provide a bias voltage to a driver IC substrate (i.e., a substrate on which the driver IC can be formed). In some examples, the one or more components of the display pixel stackups may require AC biasing, whereas the driver IC substrate may require DC biasing—in such examples, AC biasing of the driver IC substrate may cause various components on the driver IC to malfunction. The examples of the disclosure are directed to various charge pump configurations that can provide AC or DC biasing of the one or more components of the display pixel stackups, depending on an operational mode of the touch screen, while concurrently providing DC biasing of the driver IC substrate. In some examples, this can be accomplished by providing a charge pump that has separate AC and DC output nodes.

DETAILED DESCRIPTION

In the following description of examples, reference is made to the accompanying drawings that form a part hereof, and in which it is shown by way of illustration specific examples that can be practiced. It is to be understood that other examples can be used and structural changes can be made without departing from the scope of the disclosed examples.

Some capacitive touch sensor panels can be formed by a matrix of substantially transparent or non-transparent conductive plates made of materials such as Indium Tin Oxide (ITO), and some touch screens can be formed by at least partially integrating touch sensing circuitry into a display pixel stackup (i.e., the stacked material layers forming the display pixels). In some examples, one or more components (e.g., a gate line) of the display pixel stackups can be biased by a charge pump on a driver integrated circuit (IC). The charge pump can also provide a bias voltage to a driver IC substrate (i.e., a substrate on which the driver IC can be formed). In some examples, the one or more components of the display pixel stackups may require AC biasing, whereas the driver IC substrate may require DC biasing—in such examples, AC biasing of the driver IC substrate may cause various components on the driver IC to malfunction. The examples of the disclosure are directed to various charge pump configurations that can provide AC or DC biasing of the one or more components of the display pixel stackups, depending on an operational mode of the touch screen, while concurrently providing DC biasing of the driver IC substrate. In some examples, this can be accomplished by providing a charge pump that has separate AC and DC output nodes.

Figure 1A:
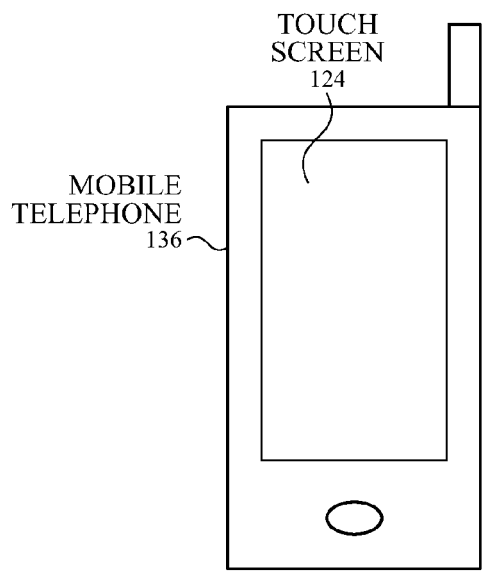
FIGS. 1A-1C illustrate an example mobile telephone, an example media player, and an example portable computing device that each include an exemplary touch screen according to examples of the disclosure.
Figure 1B:
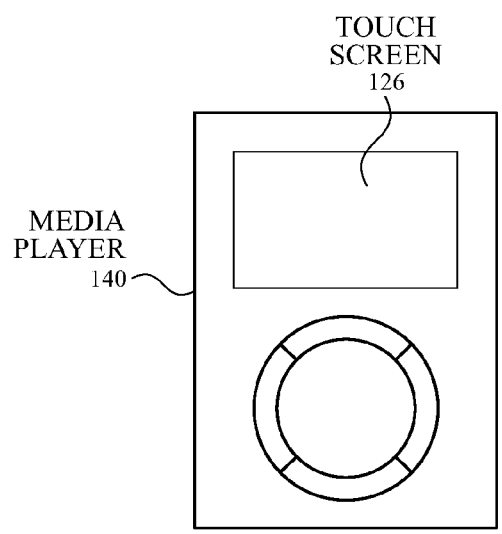
Figure 1C:
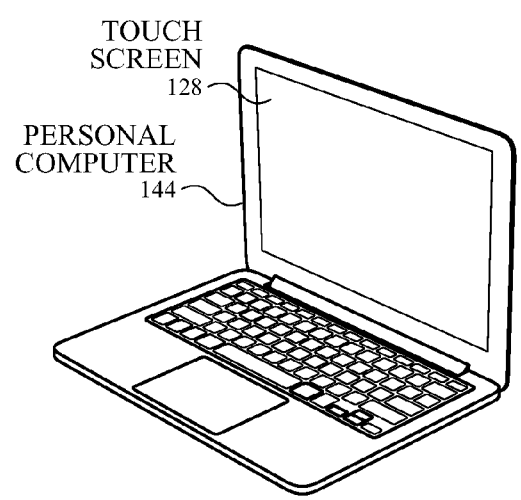

FIGS. 1A-1C show example systems in which a touch screen according to examples of the disclosure may be implemented. FIG. 1A illustrates an example mobile telephone 136 that includes a touch screen 124. FIG. 1B illustrates an example digital media player 140 that includes a touch screen 126. FIG. 1C illustrates an example portable computing device 144 that includes a touch screen 128. Touch screens 124, 126, and 128 can be based on self-capacitance. A self-capacitance based touch system can include a matrix of small, individual plates of conductive material that can be referred to as touch node electrodes (as described below with reference to touch screen 220 in FIG. 2). For example, a touch screen can include a plurality of individual touch node electrodes, each touch node electrode identifying or representing a unique location on the touch screen at which touch or proximity (i.e., a touch or proximity event) is to be sensed, and each touch node electrode being electrically isolated from the other touch node electrodes in the touch screen/panel. Such a touch screen can be referred to as a pixelated self-capacitance touch screen, though it is understood that in some examples, the touch node electrodes on the touch screen can be used to perform scans other than self-capacitance scans on the touch screen (e.g., mutual capacitance scans). During operation, a touch node electrode can be stimulated with an AC waveform, and the self-capacitance to ground of the touch node electrode can be measured. As an object approaches the touch node electrode, the self-capacitance to ground of the touch node electrode can change. This change in the self-capacitance of the touch node electrode can be detected and measured by the touch sensing system to determine the positions of multiple objects when they touch, or come in proximity to, the touch screen. In some examples, the electrodes of a self-capacitance based touch system can be formed from rows and columns of conductive material, and changes in the self-capacitance to ground of the rows and columns can be detected, similar to above. In some examples, a touch screen can be multi-touch, single touch, projection scan, full-imaging multi-touch, capacitive touch, etc.

Figure 2:
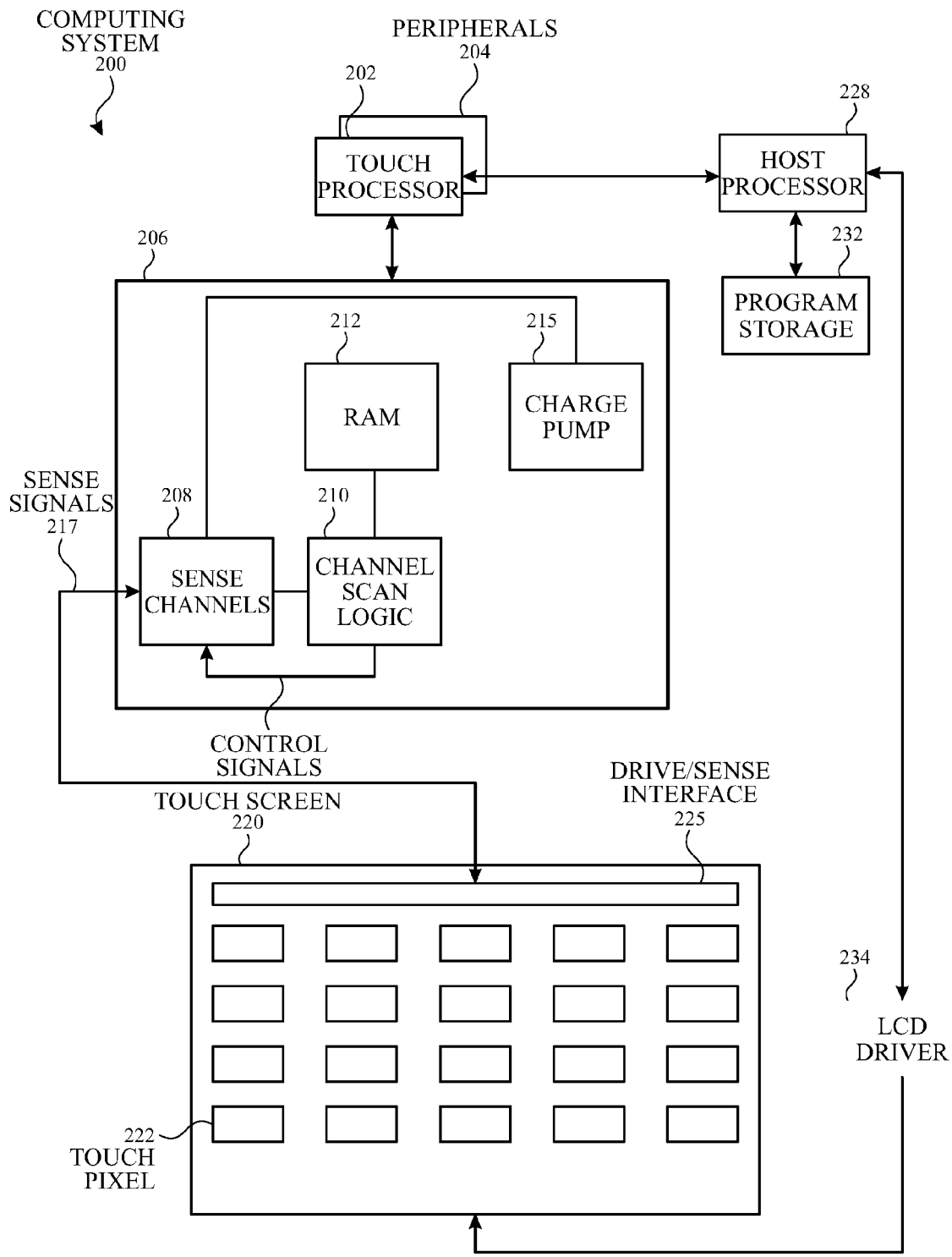
FIG. 2 is a block diagram of an example computing system that illustrates one implementation of an example self-capacitance touch screen according to examples of the disclosure.

FIG. 2 is a block diagram of an example computing system 200 that illustrates one implementation of an example self-capacitance touch screen 220 according to examples of the disclosure. Computing system 200 can be included in, for example, mobile telephone 136, digital media player 140, portable computing device 144, or any mobile or non-mobile computing device that includes a touch screen, including a wearable device. Computing system 200 can include a touch sensing system including one or more touch processors 202, peripherals 204, a touch controller 206, and touch sensing circuitry (described in more detail below). Peripherals 204 can include, but are not limited to, random access memory (RAM) or other types of memory or storage, watchdog timers and the like. Touch controller 206 can include, but is not limited to, one or more sense channels 208 and channel scan logic 210. Channel scan logic 210 can access RAM 212, autonomously read data from sense channels 208 and provide control for the sense channels. In addition, channel scan logic 210 can control sense channels 208 to generate stimulation signals at various frequencies and phases that can be selectively applied to the touch nodes of touch screen 220, as described in more detail below. In some examples, touch controller 206, touch processor 202 and peripherals 204 can be integrated into a single application specific integrated circuit (ASIC), and in some examples can be integrated with touch screen 220 itself.

Touch screen 220 can include touch sensing circuitry that can include a capacitive sensing medium having a plurality of electrically isolated touch node electrodes 222 (e.g., a pixelated self-capacitance touch screen). Touch node electrodes 222 can be coupled to sense channels 208 in touch controller 206, can be driven by stimulation signals from the sense channels through drive/sense interface 225, and can be sensed by the sense channels through the drive/sense interface as well, as described above. Labeling the conductive plates used to detect touch (i.e., touch node electrodes 222) as "touch node" electrodes can be particularly useful when touch screen 220 is viewed as capturing an "image" of touch (e.g., a "touch image"). In other words, after touch controller 206 has determined an amount of touch detected at each touch node electrode 222 in touch screen 220, the pattern of touch node electrodes in the touch screen at which a touch occurred can be thought of as a touch image (e.g., a pattern of fingers touching the touch screen).

Computing system 200 can also include a host processor 228 for receiving outputs from touch processor 202 and performing actions based on the outputs. For example, host processor 228 can be connected to program storage 232 and a display controller, such as an LCD driver 234. The LCD driver 234 can provide voltages on select (e.g., gate) lines to each pixel transistor and can provide data signals along data lines to these same transistors to control the pixel display image as described in more detail below. Host processor 228 can use LCD driver 234 to generate a display image on touch screen 220, such as a display image of a user interface (UI), and can use touch processor 202 and touch controller 206 to detect a touch on or near touch screen 220. The touch input can be used by computer programs stored in program storage 232 to perform actions that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 228 can also perform additional functions that may not be related to touch processing.

Note that one or more of the functions described herein, including the configuration of switches, can be performed by firmware stored in memory (e.g., one of the peripherals 204 in FIG. 2) and executed by touch processor 202, or stored in program storage 232 and executed by host processor 228. The firmware can also be stored and/or transported within any non-transitory computer-readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "non-transitory computer-readable storage medium" can be any medium (excluding signals) that can contain or store the program for use by or in connection with the instruction execution system, apparatus, or device. The computer-readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

Figure 3:
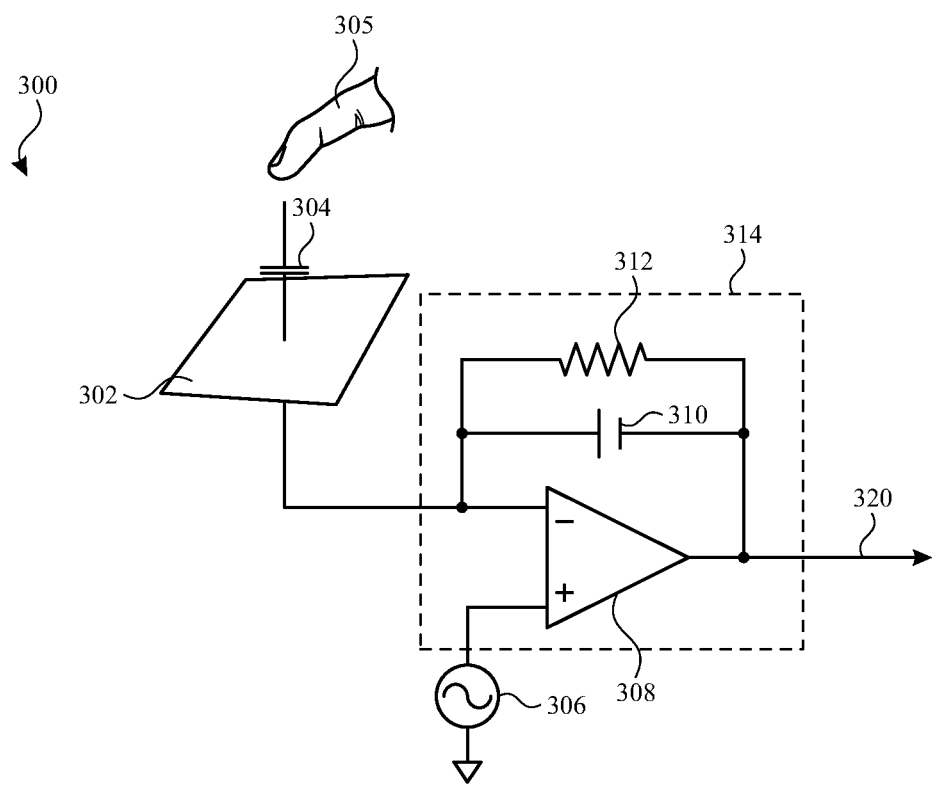
FIG. 3 illustrates an exemplary touch sensor circuit corresponding to a self-capacitance touch node electrode and sensing circuit according to examples of the disclosure.

FIG. 3 illustrates an exemplary touch sensor circuit 300 corresponding to a self-capacitance touch node electrode 302 and sensing circuit 314 according to examples of the disclosure. Touch node electrode 302 can correspond to touch node electrode 222. Touch node electrode 302 can have an inherent self-capacitance to ground associated with it, and also an additional self-capacitance to ground that is formed when an object, such as finger 305, is in proximity to or touching the electrode. The total self-capacitance to ground of touch node electrode 302 can be illustrated as capacitance 304. Touch node electrode 302 can be coupled to sensing circuit 314. Sensing circuit 314 can include an operational amplifier 308, feedback resistor 312 and feedback capacitor 310, although other configurations can be employed. For example, feedback resistor 312 can be replaced by a switched capacitor resistor in order to minimize a parasitic capacitance effect that may be caused by a variable feedback resistor. Touch node electrode 302 can be coupled to the inverting input (−) of operational amplifier 308. An AC voltage source 306 (Vac) can be coupled to the non-inverting input (+) of operational amplifier 308. Touch sensor circuit 300 can be configured to sense changes in the total self-capacitance 304 of the touch node electrode 302 induced by a finger or object either touching or in proximity to the touch sensor panel. Output 320 can be used by a processor to determine the presence of a proximity or touch event, or the output can be inputted into a discrete logic network to determine the presence of a proximity or touch event.

Figure 4:
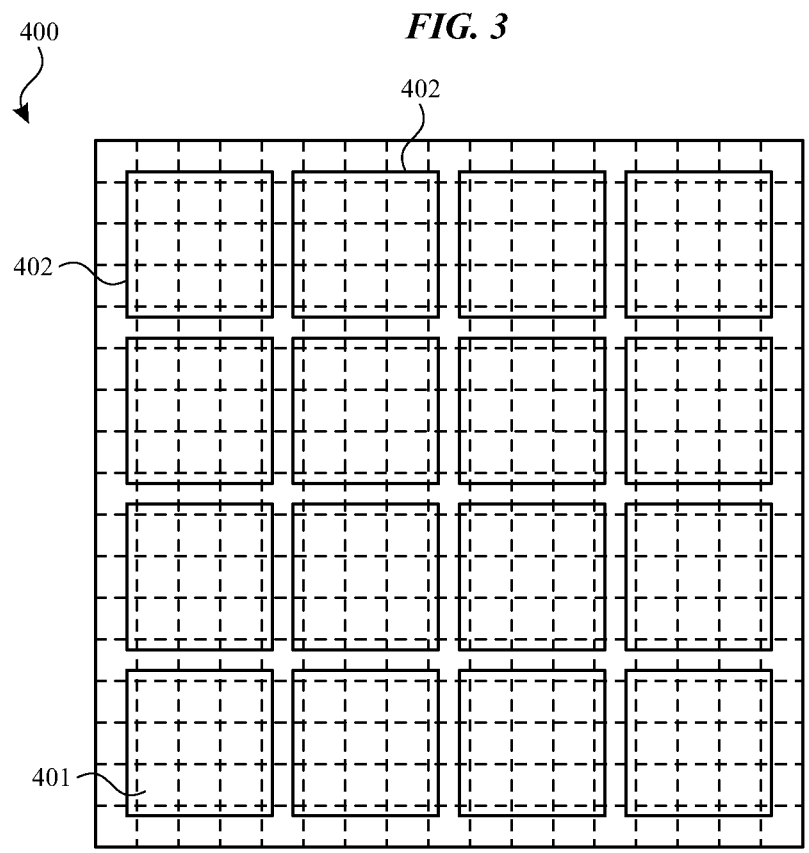
FIG. 4 illustrates an example configuration in which common electrodes can form portions of the touch sensing circuitry of a touch sensing system according to examples of the disclosure.

Referring back to FIG. 2, in some examples, touch screen 220 can be an integrated touch screen in which touch sensing circuit elements of the touch sensing system can be integrated into the display pixel stackups of a display. The circuit elements in touch screen 220 can include, for example, elements that can exist in LCD or other displays, such as one or more pixel transistors (e.g., thin film transistors (TFTs)), gate lines, data lines, pixel electrodes and common electrodes. In a given display pixel, a voltage between a pixel electrode and a common electrode can control a luminance of the display pixel. The voltage on the pixel electrode can be supplied by a data line through a pixel transistor, which can be controlled by a gate line. It is noted that circuit elements are not limited to whole circuit components, such as a whole capacitor, a whole transistor, etc., but can include portions of circuitry, such as only one of the two plates of a parallel plate capacitor. FIG. 4 illustrates an example configuration in which common electrodes 402 can form portions of the touch sensing circuitry of a touch sensing system—in some examples of this disclosure, the common electrodes can form touch node electrodes used to detect a touch image on touch screen 400, as described above. Each common electrode 402 can include a plurality of display pixels 401, and each display pixel 401 can include a portion of a common electrode 402, which can be a circuit element of the display system circuitry in the display pixel stackup (i.e., the stacked material layers forming the display pixels) of the display pixels of some types of LCDs or other displays—in other words, the common electrodes can operate as part of the display system to display a display image on touch screen 400.

In the example shown in FIG. 4, each common electrode 402 can serve as a multi-function circuit element that can operate as display circuitry of the display system of touch screen 400 and can also operate as touch sensing circuitry of the touch sensing system. Specifically, each common electrode 402 can operate as a common electrode of the display circuitry of the touch screen 400 (e.g., during a display phase), as described above, and can also operate as a touch node electrode of the touch sensing circuitry of the touch screen (e.g., during a touch sensing phase). Other circuit elements of touch screen 400 can also form part of the touch sensing circuitry. More specifically, in some examples, during the touch sensing phase, a gate line can be connected to a power supply, such as a charge pump, that can apply a voltage to maintain TFTs in display pixels included in a common electrode 402 in an "off" state. Stimulation signals can be applied to the common electrode 402. Changes in the total self-capacitance of the common electrode 402 can be sensed through one or more operational amplifiers, as previously discussed. The changes in the total self-capacitance of the common electrode 402 can depend on the proximity of an object, such as finger 305, to the common electrode. In this way, the measured changes in total self-capacitance of the common electrode 402 can provide an indication of touch on or near the touch screen.

In general, each of the touch sensing circuit elements may be either a multi-function circuit element that can form part of the touch sensing circuitry and can perform one or more other functions, such as forming part of the display circuitry, or may be a single-function circuit element that can operate as touch sensing circuitry only. Similarly, each of the display circuit elements may be either a multi-function circuit element that can operate as display circuitry and perform one or more other functions, such as operating as touch sensing circuitry, or may be a single-function circuit element that can operate as display circuitry only. Therefore, in some examples, some of the circuit elements in the display pixel stackups can be multi-function circuit elements and other circuit elements may be single-function circuit elements. In other examples, all of the circuit elements of the display pixel stackups may be single-function circuit elements.

In addition, although examples herein may describe the display circuitry as operating during a display phase, and describe the touch sensing circuitry as operating during a touch sensing phase, it should be understood that a display phase and a touch sensing phase may be operated at the same time, e.g., partially or completely overlapping, or the display phase and touch sensing phase may operate at different times. Also, although examples herein describe certain circuit elements as being multi-function and other circuit elements as being single-function, it should be understood that the circuit elements are not limited to the particular functionality in other examples. In other words, a circuit element that is described in one example herein as a single-function circuit element may be configured as a multi-function circuit element in other examples, and vice versa.

The common electrodes 402 (i.e., touch node electrodes) and display pixels 401 of FIG. 4 are shown as rectangular or square regions on touch screen 400. However, it is understood that the common electrodes 402 and display pixels 401 are not limited to the shapes, orientations, and positions shown, but can include any suitable configurations according to examples of the disclosure.

Figure 5:
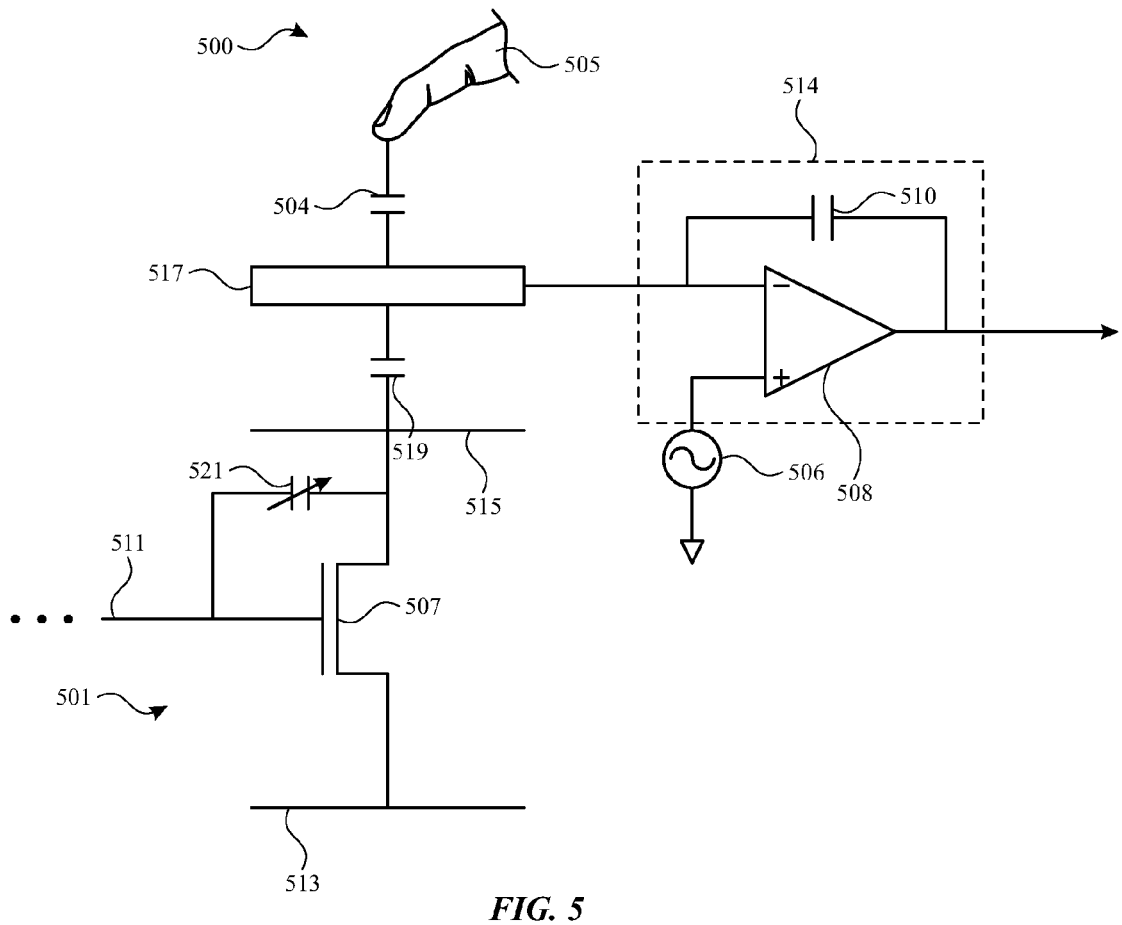
FIG. 5 illustrates a partial circuit diagram of some of the touch sensing circuitry within a display pixel of an example touch screen according to examples of the disclosure.

FIG. 5 illustrates a partial circuit diagram 500 of some of the touch sensing circuitry within display pixel 501 of an example touch screen according to examples of the disclosure. For the sake of clarity, only one display pixel 501 structure is shown. However, it is understood that other display pixels of the touch screen can include the same or similar circuitry as described below for display pixel 501. Thus, the following description of the operation of display pixel 501 can be considered a description of the operation of the touch screen, in general.

Display pixel 501 can include display TFT 507, gate line 511, data line 513, pixel electrode 515, and common electrode 517. Common electrode 517 can correspond to any one of touch node electrodes 222 in FIG. 2, touch node electrode 302 in FIG. 3 and/or common electrodes 402 in FIG. 4. Gate line 511 can supply one or more voltages to the gate terminal of display TFT 507 to control the operational state of the TFT (e.g., "on" or "off"), and data line 513 can supply one or more voltages for setting the voltage on pixel electrode 515. In some examples, gate line 511 can be shared by more than one display pixel (i.e., the gate line can be connected to the gate terminal of more than one display TFT), though a single display pixel is shown for simplicity. Storage capacitance 519 can exist between common electrode 517 and pixel electrode 515, and can store a charge—set by the voltage difference between data line 513 and common electrode 517—for controlling a luminance of display pixel 501. In some examples, offset capacitance 521 (or "parasitic capacitance") can exist between the drain terminal of display TFT 507 and the gate terminal of the TFT. Offset capacitance 521 can vary based on the voltage difference between gate line 511 and pixel electrode 515, and can include capacitances such as the gate-to-drain capacitance of TFT 507 and/or other capacitances resulting from the layout of various components of the touch screen. Operational amplifier 508 can be configured to sense changes in the total self-capacitance of common electrode 517, as described above, to determine the presence of a proximity or touch event at the common electrode. Although display pixel 501 has been described as including a single display TFT (i.e., TFT 507), in some examples, the display pixel may include more than a single TFT. For example, display pixel 501 can include two TFTs connected in series, both gate terminals of which can be connected to gate line 511. The operation of such display pixels can be substantially the same as the operation of display pixel 501 in FIG. 5. For ease of description, the examples of the disclosure will be described with reference to the display pixel configuration of FIG. 5, although it is understood that the scope of the disclosure is not so limited.

During a touch sensing phase of the touch screen, gate line 511 can supply a voltage to the gate of display TFT 507 for turning "off" the TFT. Operational amplifier 508 can sense changes in the total self-capacitance of common electrode 517. As described above, this total self-capacitance can include a touch capacitance 504 due to an object, such as finger 505, being in proximity to or touching common electrode 517, as well as other capacitances that may be seen at the common electrode. In some examples, the total self-capacitance seen at common electrode 517 can include storage capacitance 519 in series with offset capacitance 521. In some examples, storage capacitance 519 can be much larger than offset capacitance 521, and can thus dominate the non-touch-related total capacitance seen at common electrode 517. As such, the total self-capacitance seen at common electrode 517 can be approximately a combination of touch capacitance 504 and offset capacitance 521.

Ignoring touch capacitance 504, the gain of operational amplifier 508 in the configuration illustrated in FIG. 5 can be expressed as:

$$A = 1 + C_{gp}/C_{fb} \qquad (1)$$

where A can represent the gain of the operational amplifier, $C_{fb}$ can correspond to feedback capacitance 510, and $C_{gp}$ can correspond to offset capacitance 521. In some examples, offset capacitance 521 can be on the order of nanofarads (~1 nF, in some examples), and feedback capacitance 510 can be on the order of picofarads (~10 pF, in some examples). In such cases, the gain of operational amplifier 508 due only to offset capacitance 521 can be approximately 101. In other words, an input voltage of 1V provided by AC voltage source 506 at the non-inverting input of operational amplifier 508 can result in an output voltage of 101V at the output of the operational amplifier. With such a large offset due simply to offset capacitance 521, it can be difficult to detect changes in the output voltage of operational amplifier 508 resulting from changes in touch capacitance 504, and thus it can be difficult to detect touch and/or proximity events on the touch screen. Additionally, the dynamic range of sensing circuit 514 can be significantly reduced due to offset capacitance 521, and in some examples may render the sensing circuit inoperable.

Figure 6:
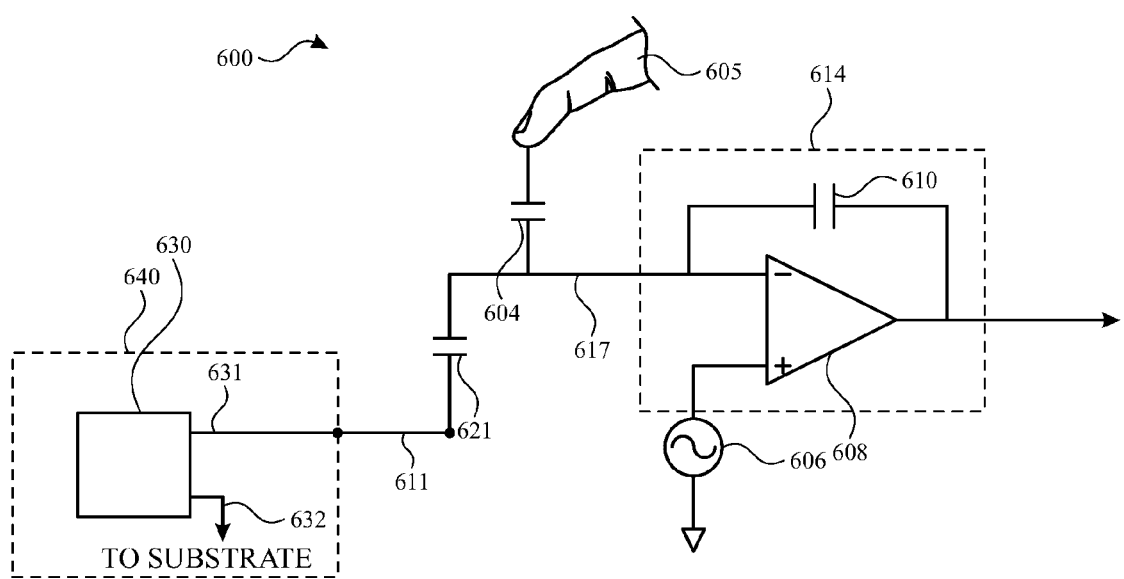
FIG. 6 illustrates an example electrical circuit corresponding to a self-capacitance touch node electrode, a sensing circuit and a driver integrated circuit (IC) according to examples of the disclosure.

FIG. 6 illustrates an example electrical circuit 600 corresponding to self-capacitance touch node electrode 617, sensing circuit 614 and driver integrated circuit (IC) 640 according to examples of the disclosure. Electrical circuit 600 can be a simplified version of circuit diagram 500 in FIG. 5. For example, touch node electrode 617 can correspond to common electrode 517 in FIG. 5, sensing circuit 614 can correspond to sensing circuit 514 in FIG. 5, and gate line 611 can correspond to gate line 511 in FIG. 5. Circuit 600 can additionally include driver IC 640, which can be coupled to gate line 611. Offset capacitance 621, as before, can exist between touch node electrode 617 and gate line 611. In some examples, driver IC 640 can include charge pump 630, which can be formed on or in a driver IC substrate, as will be described in more detail later. During a non-touch sensing phase of the touch screen (e.g., during a display phase), charge pump 630 can output a direct current (DC) voltage via output line 631 to gate line 611 to facilitate proper touch screen operation (e.g., to turn on or off pixel TFT 507 in FIG. 5), as described previously in this disclosure. During a touch sensing phase of the touch screen, in some examples, charge pump 630 can output an alternating current (AC) voltage—in some examples, offset by the same or a different DC voltage as outputted during the non-touch sensing phase of the touch screen—via output line 631 to gate line 611. This driving of gate line 611 with an AC voltage can be referred to as "bootstrapping." In some cases, the AC voltage outputted by output line 631 to gate line 611 can be substantially the same as an AC voltage provided by AC voltage source 606 to operational amplifier 608. Because of the operational characteristics of operational amplifier 608, the voltage at common electrode 617 can also be substantially the same as the voltage provided by AC voltage source 606. Thus, the voltage and/or changes in the voltage on common electrode 617 and gate line 611 can be substantially the same, and therefore the voltage and/or changes in the voltage across offset capacitance 621 can be substantially eliminated; as such, the current flow into the offset capacitance can also be virtually eliminated. As a result, the effect of offset capacitance 621 on the total self-capacitance seen at touch node electrode 617 can be substantially reduced. In this way, changes in touch capacitance 604, and the effect of the touch capacitance on the output voltage of operational amplifier 608, can be more readily detected, and thus touch and/or proximity events can be more easily sensed. Thus, it can be beneficial for charge pump 630 to output the DC voltage to gate line 611 during a non-touch sensing phase of the touch screen, and output the AC voltage (in some examples, offset by a DC voltage) to the gate line 611 during a touch sensing phase of the touch screen. In some examples, charge pump 630 and AC voltage source 606 can be combined or can be located on the same driver IC 640.

Figure 7:
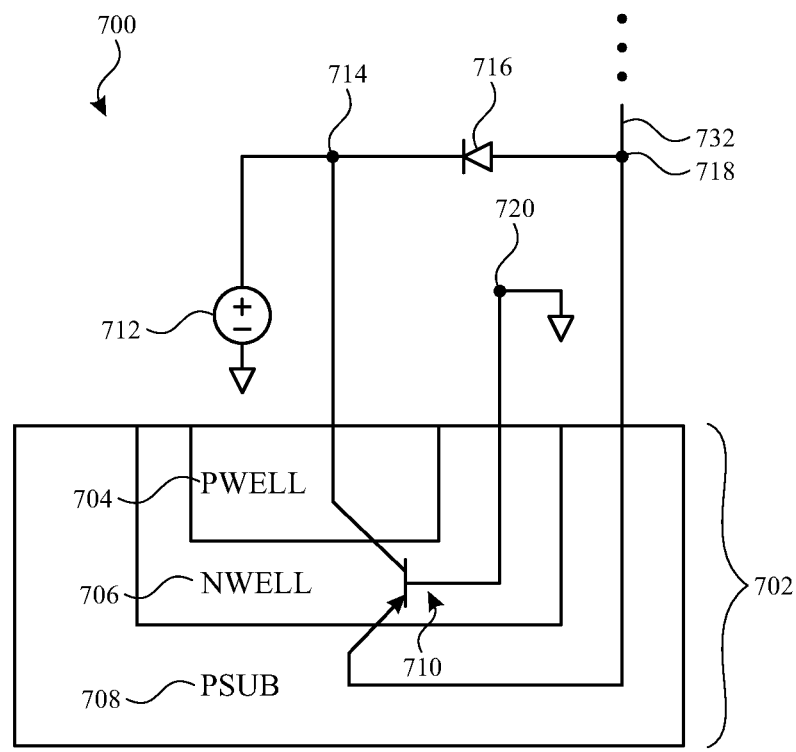
FIG. 7 illustrates a cross section of a driver IC substrate, and a biasing scheme via which a charge pump can bias the driver IC substrate according to examples of the disclosure.

In some examples, charge pump 630 can, in addition to outputting DC or AC voltages to gate line 611, bias the driver IC substrate on which it is formed via output line 632. Such biasing can ensure that various semiconductor junctions in the substrate (e.g., P-N junctions) function properly during touch screen operation, as will be discussed below. It should be noted that charge pump 630 is illustrated as having two output lines—output lines 631 and 632—in some examples, those two output lines can be coupled to the same output node in the charge pump; in other words, the two output lines can both output the same output voltage. FIG. 7 illustrates cross section 700 of driver IC substrate 702, and a biasing scheme via which charge pump 630 can bias the driver IC substrate according to examples of the disclosure.

As described previously, charge pump 630 can be formed on driver IC substrate 702. In some examples, driver IC substrate 702 can include P-type substrate (PSUB) 708. A deep N-type well (NWELL) 706 can be formed within PSUB 708, and a P-type well (PWELL) 704 can be formed within NWELL 706. PSUB 708, NWELL 706 and PWELL 704 can provide various semiconductor environments in which various components (e.g., transistors) of charge pump 630 can operate. However, these P-type and N-type wells can create a parasitic PNP bipolar junction, illustrated by parasitic bipolar junction transistor (BJT) 710. It can be beneficial to prevent parasitic BJT 710 from unintentionally turning on, which can be accomplished by biasing PWELL 704, NWELL 706 and PSUB 708 at appropriate voltages. For example, in the configuration illustrated in FIG. 7, node 714 can be coupled to PWELL 704, node 720 can be coupled to NWELL 706 and node 718 can be coupled to PSUB 708. Node 714 (and thus PWELL 704) can be coupled to DC voltage source 712. DC voltage source 712 can be a negative rail voltage of the driver IC, and can have a voltage of −5.7V, for example. Node 720 (and thus NWELL 706) can be coupled to ground (i.e., 0V). Node 718 (and thus PSUB 708) can be coupled to line 732, which can correspond to output line 632 from charge pump 630 in FIG. 6. In other words, charge pump 630 can bias PSUB 708 via node 718. In some examples, PSUB 708 can be biased at −7V. Thus, in a steady state, all of the P-N junctions between PWELL 704, NWELL 706 and PSUB 708 can be reverse biased, and parasitic BJT 710 can remain off. It is understood that the voltages provided above and throughout this disclosure are exemplary only, and that different voltages can be utilized in accordance with the examples of this disclosure.

In some examples, the voltage at output line 632 of charge pump 630 in FIG. 6 (and thus the voltage at node 718) may take a non-zero amount of time to ramp from 0V (e.g., when the charge pump is inactive or off) to −7V. During this ramping time, parasitic BJT 710 can contribute to lateral latch up (i.e., the inadvertent creation of a low-impedance path between, for example, power supply nodes) in driver IC substrate 702. To prevent latch up, Schottky diode 716—in some examples, external to driver IC substrate 702—can be inserted between nodes 714 and 718, as illustrated. Schottky diode 716 can ensure that the voltage at node 718 is not greater than (i.e., more positive than) the voltage at node 714 by more than a turn-on voltage of the Schottky diode. As such, Schottky diode 716 can maintain the voltage at node 718 (and thus at PSUB 708) at an acceptable level until charge pump 630 ramps to its final voltage, which in some examples can be −7V. Once charge pump 630 and node 718 ramp to −7V, PWELL 704, NWELL 706 and PSUB 708 can be biased appropriately, and the driver IC can function properly.

As described previously, charge pump 630 in FIG. 6 can bias driver IC substrate 702. Further, during certain periods of time (e.g., during a touch sensing phase of the touch screen), charge pump 630 can output an AC voltage rather than a DC voltage. This can mean that node 718 can be biased at an AC voltage during certain periods of touch screen operation. In some examples, an AC voltage at node 718 can cause Schottky diode 716 to become forward biased and to turn on, which can cause a large amount of current to flow through the Schottky diode, wasting power and possibly causing damage to the driver IC and other components of the touch screen. For example, if node 714 is biased at −5.7V, and node 718 is biased at a DC voltage of −7V with a 3V peak-to-peak AC signal, the voltage at node 718 can reach as high as −5.5V. With −5.7V at node 714 and −5.5V at node 718, Schottky diode 716 can become forward biased, and a large amount of current can flow through the Schottky diode. This can be undesirable. It can, therefore, be beneficial to bias node 718 with a DC voltage (e.g., −7V) during all time periods of touch screen operation, even when gate line 611 is biased at an AC voltage (e.g., −7V with 3V peak-to-peak AC voltage) during the touch sensing phase of the touch screen. A charge pump with a single output node may not be able to provide such operation.

Figure 8A:
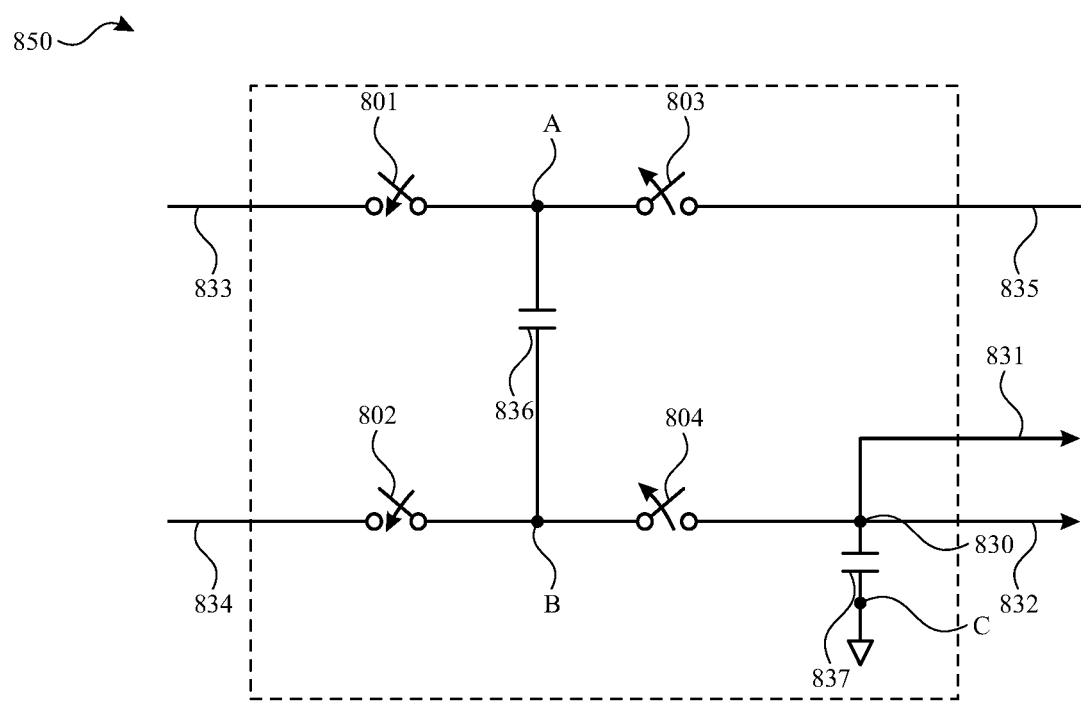
FIGS. 8A-8B illustrate exemplary operation and structure of a charge pump with a single output node according to examples of the disclosure.
Figure 8B:
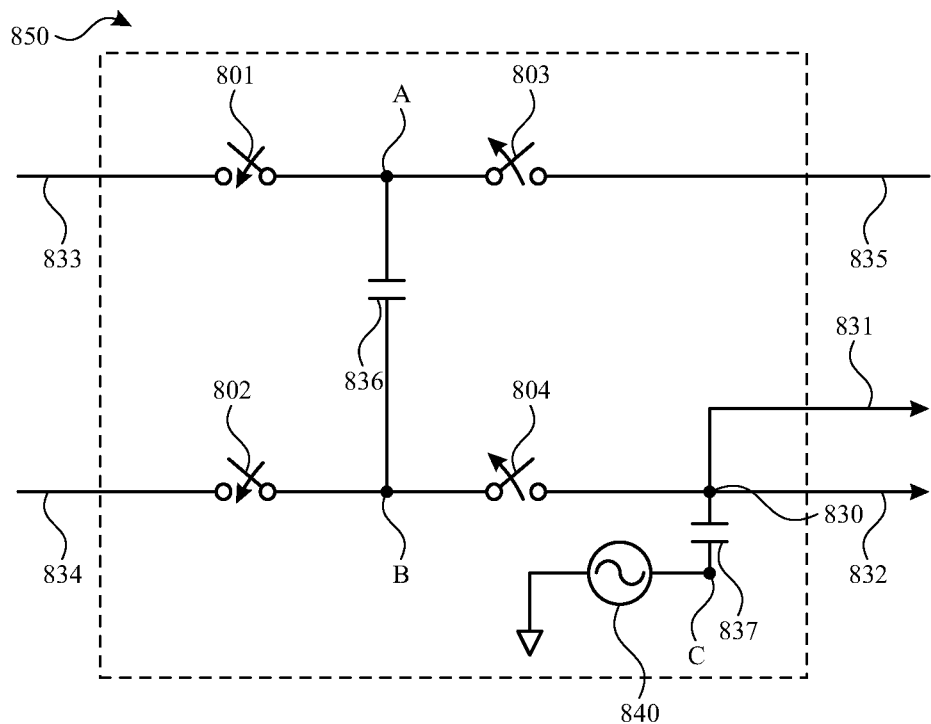

FIGS. 8A-8B illustrate exemplary operation and structure of charge pump 850 with single output node 830 according to examples of the disclosure. Specifically, FIG. 8A illustrates exemplary operation and structure of charge pump 850 in a non-touch sensing mode of the charge pump (e.g., corresponding to the display phase of the touch screen), and FIG. 8B illustrates exemplary operation and structure of the charge pump in a touch sensing mode of the charge pump (e.g., corresponding to the touch sensing phase of the touch screen). As illustrated in FIG. 8A, charge pump 830 can include charging capacitor 836, positive voltage input 833, first negative voltage input 834, second negative voltage input 835, output capacitor 837, output line 831 and output line 832. Output lines 831 and 832, and output capacitor 837, can all be coupled to output node 830, as illustrated. Output lines 831 and 832 can correspond to output lines 631 and 632 in FIG. 6. During charge pump 850 operation, a positive voltage, AVDDH, can be supplied to positive voltage input 833, and a negative voltage, AVDDN, can be supplied to negative voltage inputs 834 and 835. In some examples, AVDDH can be +5.7V and AVDDN can be −5.7V, which can also be the voltage supplied by voltage source 712 to node 714 in FIG. 7. Switch 801 can be coupled between positive voltage input 833 and terminal A of charging capacitor 836. Switch 802 can be coupled between first negative voltage input 834 and terminal B of charging capacitor 836. Switch 803 can be coupled between second negative voltage input 835 and terminal A of charging capacitor 836. Switch 804 can be coupled between output node 830 and terminal B of charging capacitor 836.

In order to provide a voltage at output node 830, charge pump 850 can alternate between a first stage of operation and a second stage of operation. During the first stage of operation, switches 801 and 802 can be closed, and switches 803 and 804 can be open. Terminal A of charging capacitor 836 can be charged by voltage AVDDH, while terminal B of the charging capacitor can be charged by voltage AVDDN, thus establishing a voltage across the charging capacitor of substantially the voltage difference between AVDDH and AVDDN—in some examples, this voltage difference can be +11.4V (+5.7V−(−5.7V)). During the second stage of operation, switches 801 and 802 can be opened, and switches 803 and 804 can be closed. Voltage AVDDN can be applied to terminal A of charging capacitor 836 via second negative voltage input 835, thus transferring (or "pumping") charge from the charging capacitor to output capacitor 837. Output capacitor 837 can store the charge, which can create a voltage at output node 830 that can depend on the capacitance of the output capacitor. In some examples, the voltage at output node 830 can depend on a ratio of the capacitance of charging capacitor 836 to the capacitance of output capacitor 837. Output lines 831 and 832 can output the voltage at output node 830 to gate line 611 in FIG. 6 and to driver IC substrate 702 in FIG. 7, as previously described. The timing of alternating between the first and second stages of operation can be such that capacitors 836 and 837 can be appropriately charged and discharged so as to create a substantially steady DC voltage at output node 830, which can be outputted by both output lines 831 and 832 during the non-touch sensing phase of charge pump 850. In some examples, switches 801, 802, 803 and 804 can be controlled by one clock signal; in some examples, switches 801 and 802 can be controlled by a first clock signal, and switches 803 and 804 can be controlled by a second clock signal. The above clock signals can be provided by a touch controller (e.g., touch controller 206).

FIG. 8B illustrates exemplary operation and structure of charge pump 850 in a touch sensing mode of the charge pump according to examples of the disclosure. During the touch sensing mode, charge pump 850 can operate substantially the same as during the non-touch sensing mode to charge or maintain the voltage at output node 830 at the proper DC voltage (e.g., −7V). However, instead of terminal C of output capacitor 837 being grounded (as in FIG. 8A), terminal C of the output capacitor can be coupled to AC voltage source 840 (e.g., a buffer or other circuitry that can provide an AC signal to its output). AC voltage source 840 can, through output capacitor 837, modulate the voltage at output node 830 in accordance with the peak-to-peak voltage provided by the AC voltage source. That is to say that output capacitor 837 can provide the DC component of the voltage at output node 830, and AC voltage source 840 can provide the AC component of the voltage at the output node. For example, output capacitor 837 can be charged to provide −7V at output node 830, and AC voltage source 840 can modulate that voltage with a 3V peak-to-peak signal, thus providing a 3V peak-to-peak AC voltage on output lines 831 and 832 having a DC offset of −7V. Output line 831 can output the AC voltage on output node 830 to, for example, gate line 611, as illustrated in FIG. 6. In some examples, terminal C of output capacitor 837 can be coupled to a switch (e.g., any type of switching circuitry) that can selectively couple terminal C of the output capacitor to ground or to AC voltage source 840. For example, during the non-touch sensing mode of charge pump 850, the switch can couple terminal C of output capacitor 837 to ground (as illustrated in FIG. 8A), and during the touch sensing mode of the charge pump, the switch can couple terminal C of the output capacitor to AC voltage source 840 (as illustrated in FIG. 8B). In some examples, the state of this switch can be controlled by a touch controller (e.g., touch controller 206 in FIG. 2). It is noted that while terminal C of output capacitor 837 is illustrated as being grounded in FIG. 8A, in some examples, terminal C of the output capacitor can be coupled to another reference voltage (e.g., +/−1V, +/−2V, etc.).

As explained with respect to FIG. 6, it can be beneficial to provide an AC voltage to gate line 611 via output line 631 during a touch sensing mode of charge pump 630 in order to "bootstrap" the touch screen. However, as explained with respect to FIG. 7, it can be problematic to bias driver IC substrate 702, via output line 632, at that AC voltage. Charge pump 850 of FIGS. 8A and 8B has only one output node (output node 830), and thus cannot concurrently output an AC voltage to gate line 611 (for "bootstrapping") and a DC voltage to driver IC substrate 702 (for driver IC substrate biasing).

Figure 9A:
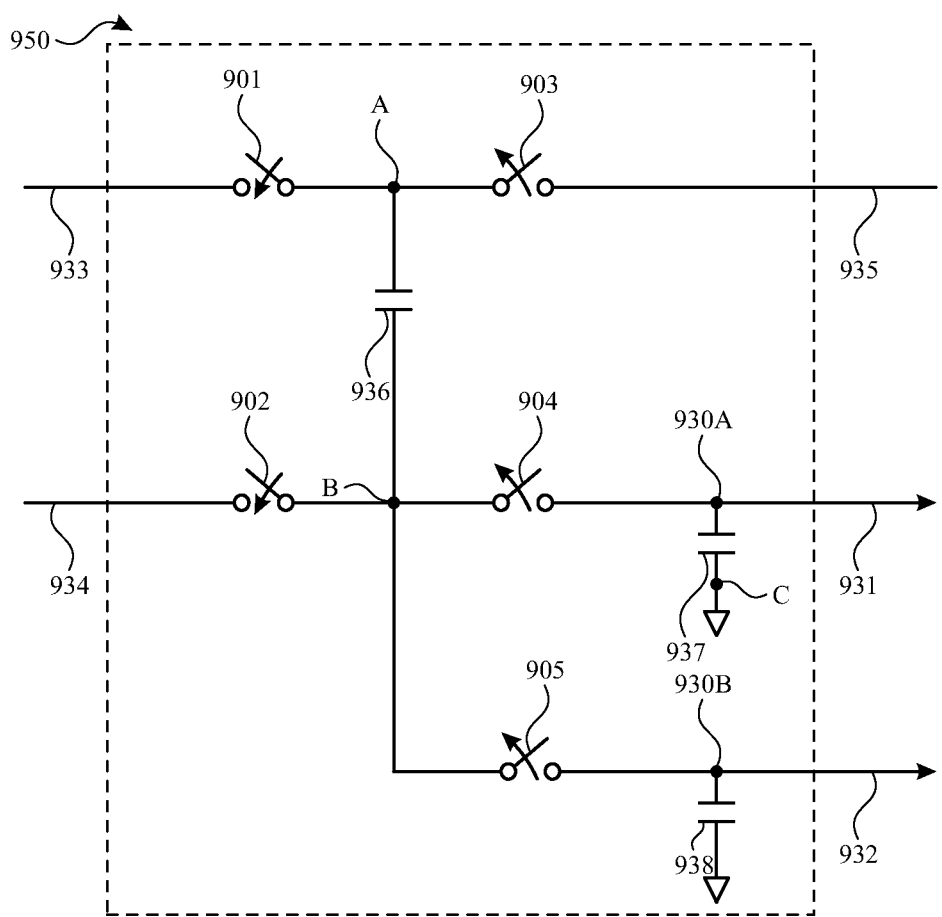
FIGS. 9A-9B illustrate exemplary operation and structure of a charge pump with two output nodes according to examples of the disclosure.
Figure 9B:
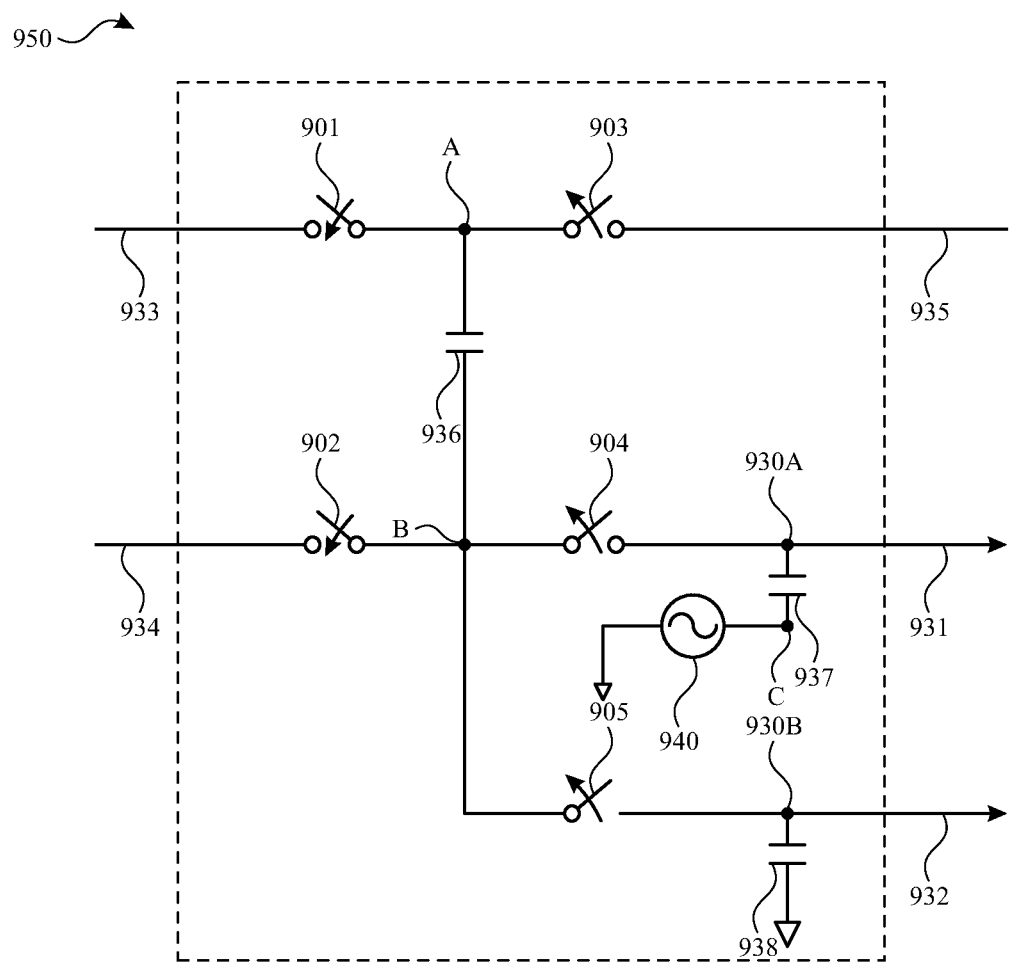

FIGS. 9A-9B illustrate exemplary operation and structure of charge pump 950 with two output nodes 930a and 930b according to examples of the disclosure. While two output nodes 930a and 930b are illustrated, additional output nodes can be implemented in accordance with and in an analogous manner to that described below. FIG. 9A illustrates exemplary operation and structure of charge pump 950 in a non-touch sensing mode of the charge pump (e.g., corresponding to the display phase of the touch screen), and FIG.

9B illustrates exemplary operation and structure of the charge pump in a touch sensing mode of the charge pump (e.g., corresponding to the touch sensing phase of the touch screen). Referring to FIG. 9A, the configuration of charge pump 950 can be substantially the same as the configuration of charge pump 850 in FIG. 8A, except that charge pump 950 can additionally include switch 905 and output capacitor 938, as illustrated. Switch 905 can be coupled between terminal B of charging capacitor 936 and output node 930*b*, and output capacitor 938 can be coupled to output node 930*b*. Output capacitor 937 can provide an output voltage at output node 930*a*, which can be outputted by output line 931, and output capacitor 938 can provide an output voltage at output node 930*b*, which can be outputted by output line 932.

The operation of charge pump 950 can be substantially the same as that of charge pump 850 in FIG. 8A. Switch 905 can operate with substantially the same timing and substantially the same behavior as switches 903 and 904 (which can correspond to switches 803 and 804 in FIG. 8A). In some examples, switches 901, 902, 903, 904 and 905 can be controlled by one clock signal; in some examples, switches 901 and 902 can be controlled by a first clock signal, and switches 903, 904 and 905 can be controlled by a second clock signal. In some examples, switches 904 and 905 can be controlled by different clock signals. The above clock signals can be provided by a touch controller (e.g., touch controller 206).

Operating in the manner described with respect to FIG. 8A, not only can output capacitor 937 be charged to a particular voltage, but so can output capacitor 938. In this way, charge pump 950 can have two output nodes 930*a* and 930*b* from which voltages can be outputted via output lines 931 and 932, respectively. The voltages at output nodes 930*a* and 930*b* can depend on ratios of the capacitance of charging capacitor 936 to the capacitances of output capacitors 937 and 938, respectively. In some examples, output capacitors 937 and 938 can have substantially the same capacitances, in which case the voltages at output nodes 930*a* and 930*b* can be substantially the same. In some examples, output capacitors 937 and 938 can have substantially different capacitances, in which case the voltages at output nodes 930*a* and 930*b* can be substantially different. During a non-touch sensing mode of charge pump 950, the charge pump can charge output nodes 930*a* and 930*b* to respective DC voltages—output line 931 can output the DC voltage on output node 930*a* to, for example, gate line 611, as illustrated in FIG. 6, and output line 932 can output the DC voltage on output node 930*b* to, for example, PSUB 708, as illustrated in FIG. 7.

FIG. 9B illustrates exemplary operation and structure of charge pump 950 during a touch sensing mode of the charge pump according to examples of the disclosure. During the touch sensing mode, charge pump 950 can operate substantially the same as during the non-touch sensing mode to charge or maintain the voltages at output nodes 930*a* and 930*b* at the proper DC voltages (e.g., −7V). However, instead of terminal C of output capacitor 937 being grounded (as in FIG. 9A), terminal C of the output capacitor can be coupled to AC voltage source 940 (e.g., a buffer or other circuitry that can provide an AC signal to its output). AC voltage source 940 can, through output capacitor 937, modulate the voltage at output node 930*a* in accordance with the peak-to-peak voltage provided by the AC voltage source. That is to say that output capacitor 937 can provide the DC component of the voltage at output node 930*a*, and AC voltage source 940 can provide the AC component of the voltage at output node 930*a*. For example, output capacitor 937 can be charged to provide −7V at output node 930*a*, and AC voltage source 940 can modulate that voltage with a 3V peak-to-peak signal, thus providing a 3V peak-to-peak AC voltage on output line 931 having a DC offset of −7V. Output line 931 can output the AC voltage on output node 930*a* to, for example, gate line 611, as illustrated in FIG. 6. Similar to as described with reference to FIGS. 8A-8B, in some examples, terminal C of output capacitor 937 can be coupled to a switch (e.g., any type of switching circuitry) that can selectively couple terminal C of the output capacitor to ground or to AC voltage source 940. For example, during the non-touch sensing mode of charge pump 950, the switch can couple terminal C of output capacitor 937 to ground (as illustrated in FIG. 9A), and during the touch sensing mode of the charge pump, the switch can couple terminal C of the output capacitor to AC voltage source 940 (as illustrated in FIG. 9B). In some examples, the state of this switch can be controlled by a touch controller (e.g., touch controller 206 in FIG. 2). It is noted that while output capacitors 937 and 938 are illustrated as being grounded in FIG. 9A, in some examples, the output capacitors can be coupled to other reference voltages (e.g., +/−1V, +/−2V, etc.).

While output node 930*a* and output line 931 can provide an AC voltage output from charge pump 950, output node 930*b* and output line 932 can continue to provide a DC voltage output from the charge pump, even during the touch sensing mode of the charge pump. This can be due to the fact that output capacitor 938 can remain grounded in the touch sensing mode of charge pump 950, and can function in substantially the same manner as it does in the non-touch sensing mode of the charge pump (illustrated in FIG. 9A). In this way, output line 932 can output a DC voltage to, for example, PSUB 708, as illustrated in FIG. 7, even while output line 931 outputs an AC voltage to, for example, gate line 611, as illustrated in FIG. 6. In some examples, output line 931 can also output an AC voltage to, for example, operational amplifier 308, 508 and/or 608.

Figure 9C:
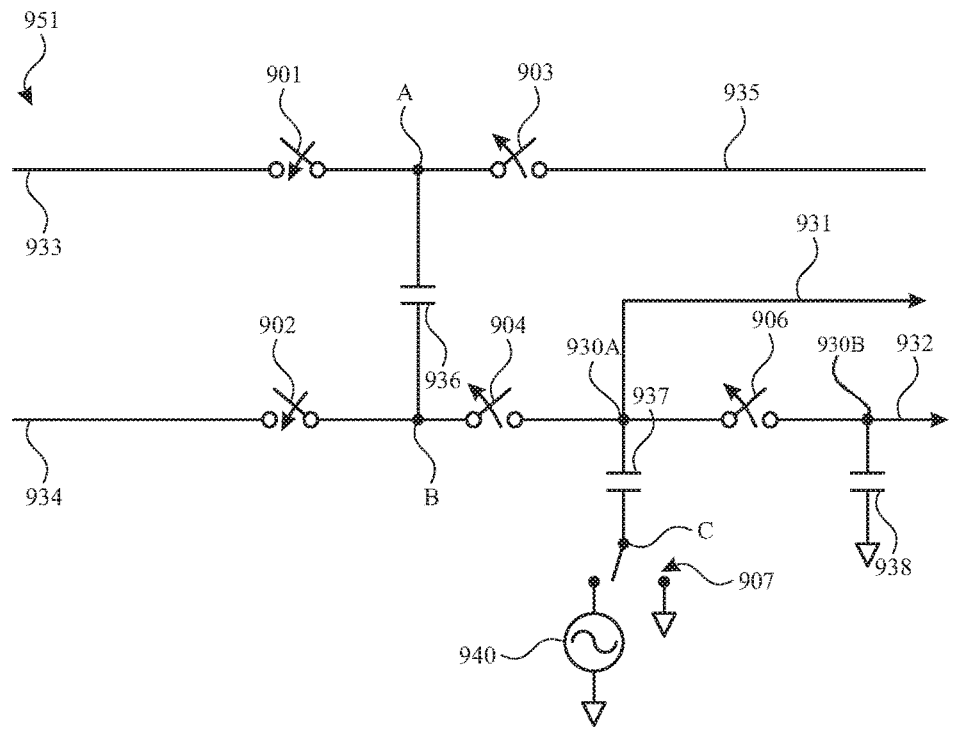
FIG. 9C illustrates exemplary operation and structure of another charge pump with two output nodes according to examples of the disclosure.

FIG. 9C illustrates exemplary operation and structure of another charge pump 951 with two output nodes 930*a* and 930*b* according to examples of the disclosure. Like charge pump 950 in FIGS. 9A-9B, charge pump 951 in FIG. 9C can have two output nodes 930*a* and 930*b* coupled to output lines 931 and 932, respectively. Similar to above, during a non-touch sensing mode of charge pump 951, output lines 931 and 932 can output respective DC voltages; during a touch sensing mode of the charge pump, output line 931 can output an AC voltage, and output line 932 can output a DC voltage. However, instead of output capacitors 937 and 938 being coupled in parallel to terminal B of charging capacitor 936 (as in FIGS. 9A-9B), output capacitors 937 and 938 can be coupled in series to terminal B of the charging capacitor, as illustrated in FIG. 9C. Switch 906 in FIG. 9C can operate in substantially the same manner and with substantially the same timing as switch 905 in FIGS. 9A-9B. Thus, the operation of charge pump 951 can be substantially the same as the operation of charge pump 950 in FIGS. 9A-9B in charging output capacitors 937 and 938 to respective DC voltages. As described previously with respect to FIG. 9B, the voltage at output node 930*a* (and thus output line 931) can be modulated during the touch sensing mode of charge pump 951 by AC voltage source 940—that is to say that switch 907 can couple terminal C of output capacitor 937 to the AC voltage source during the touch sensing mode of the charge pump. During the non-touch sensing mode of charge pump 951, switch 907 can couple terminal C of output capacitor 937 to ground, and output node 930*a* can output a DC voltage via output line 931. Output node 930b can output a DC voltage via output line 932 during both the touch sensing and non-touch sensing modes of charge pump 951, as described previously. Switches 901, 902, 903, 904, 906 and 907 can be controlled by a touch controller (e.g., touch controller 206). Other details relating to the operation and structure of charge pump 951, and the various voltages outputted by the charge pump, can be as described above with respect to charge pump 950 in FIGS. 9A-9B, and will be omitted here for brevity.

Thus, as described above, charge pump 950 of FIGS. 9A and 9B, and charge pump 951 of FIG. 9C, can supply a DC voltage to gate line 611 in FIG. 6 during a non-touch sensing mode of the charge pumps, and an AC voltage to the gate line during a touch sensing mode of the charge pumps. Concurrently, charge pumps 950 and 951 can supply a DC voltage to PSUB 708 in FIG. 7 during both the non-touch sensing and the touch sensing modes of the charge pumps. Thus, turn-on of Schottky diode 716 in FIG. 7 can be avoided.

Figure 10:
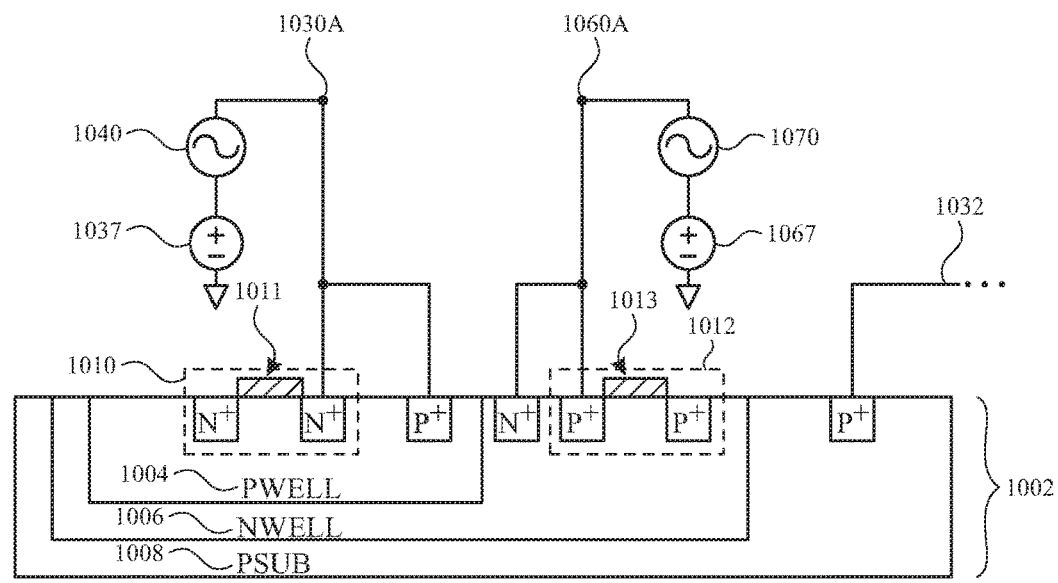
FIG. 10 illustrates a switch, which can correspond to a switch in the charge pump of FIG. 9B, formed in a P-type well of a driver IC substrate according to examples of the disclosure.

As described previously, the charge pump of the disclosure can be formed in the driver IC substrate. Thus, one or more of switches 901, 902, 903, 904, 905, 906 and 907 can be implemented by transistors that can be formed in PWELL 704, NWELL 706 and/or PSUB 708 of driver IC substrate 702 in FIG. 7. FIG. 10 illustrates switch 1010, which can correspond to switch 904 from FIG. 9B, formed in PWELL 1004 according to examples of the disclosure. In some examples, switch 1010 can be implemented by transistor 1011. Transistor 1011 can be an nMOSFET (n-type metal-oxide-semiconductor field-effect transistor), the drain of which can be coupled to node 1030a—node 1030a can also be coupled to PWELL 1004. Node 1030a can correspond to node 930a in FIG. 9B. As discussed with reference to FIG. 9B, during the touch sensing mode of charge pump 950, the voltage at node 930a (and thus at 1030a) can include a DC component (represented by DC voltage source 1037) and an AC component (represented by AC voltage source 1040). Therefore, the voltage at PWELL 1004 can include the DC component and the AC component—in some examples, these can be −7V and 3V peak-to-peak, respectively. The voltage at PWELL 1004 can, therefore, range from −5.5V to −8.5V.

PSUB 1008 can be biased by the charge pump at a DC voltage, as described previously. Specifically, PSUB 1008 can be coupled to line 1032, which can correspond to output line 932 in FIG. 9B. In some examples, the voltage on line 1032 can be a DC voltage, such as −7V. Therefore, the voltage at PSUB 1008 can be −7V.

In some examples, the driver IC of the disclosure can include multiple charge pumps: charge pump 630 (as described with reference to FIGS. 8-9) that can output relatively low voltages (e.g., negative voltages), and a second charge pump that can output relatively high voltages (e.g., positive voltages). For example, charge pump 630 can output voltages in the range of −7V (AC and/or DC), whereas the second charge pump on the driver IC can output voltages in the range of +11V (AC and/or DC). These relatively high voltages can be utilized by the touch screen when high voltages are needed for touch screen operation—for example, to turn on pixel TFT 507 in FIG. 5. The second charge pump can operate analogously to charge pump 630, except that the switches of the second charge pump can be implemented with pMOSFETs (p-type MOSFETs) instead of nMOSFETs due to the relatively high voltages that the second charge pump can produce. Switch 1012 in FIG. 10, implemented by pMOSFET 1013, can correspond to such a switch in the second charge pump. The source of transistor 1013 can be coupled to node 1060a—node 1060a can also be coupled to NWELL 1006. Node 1060a can correspond to an AC signal output node in the second charge pump (analogous to node 1030a with respect to charge pump 630). During the touch sensing mode of the second charge pump, the voltage at the AC signal output node in the second charge pump (and thus at 1060a) can include a DC component (represented by DC voltage source 1067) and an AC component (represented by AC voltage source 1070). Therefore, the voltage at NWELL 1006 can include the DC component and the AC component—in some examples, these can be +11V and 3V peak-to-peak, respectively. The voltage at NWELL 1006 can, therefore, range from +9.5V to +12.5V.

In summary, the voltage at PWELL 1004 can range from −5.5V to −8.5V, the voltage at NWELL 1006 can range from +9.5V to +12.5V, and the voltage at PSUB 1008 can be −7V. Therefore, all of the P-N junctions in driver IC substrate 1002 can remain reverse biased, and the components formed in the driver IC substrate can function properly. As such, the multiple-output node charge pumps of the disclosure can function on a single driver IC substrate. It is understood that the voltages provided above and throughout this disclosure are exemplary only, and that different voltages can be utilized in accordance with the examples of this disclosure.

Thus, the examples of the disclosure provide a charge pump configuration that has AC and DC outputs that can be used for concurrently "bootstrapping" the touch screen of the disclosure and biasing the driver IC substrate of the disclosure.

Therefore, according to the above, some examples of the disclosure are directed to a charge pump configured to operate in a first mode and a second mode, the charge pump comprising: a charging capacitor coupled to a first node and configured to transfer a first direct current (DC) voltage to the first node; a first output node coupled to the first node; and a second output node coupled to the first node, wherein: during the first mode, the first output node is configured to output a second DC voltage based on the first DC voltage, and the second output node is configured to output a third DC voltage based on the first DC voltage, and during the second mode, the first output node is configured to output the second DC voltage based on the first DC voltage, and the second output node is configured to output an alternating current (AC) voltage, the AC voltage being offset by the third DC voltage. Additionally or alternatively to one or more of the examples disclosed above, in some examples, the first output node is coupled to the first node via a first switch, and the second output node is coupled to the first node via a second switch. Additionally or alternatively to one or more of the examples disclosed above, in some examples, the first switch and the second switch are controlled by a single clock signal. Additionally or alternatively to one or more of the examples disclosed above, in some examples, the first switch and the second switch are controlled by different clock signals. Additionally or alternatively to one or more of the examples disclosed above, in some examples, the second DC voltage and the third DC voltage are the same. Additionally or alternatively to one or more of the examples disclosed above, in some examples, the charge pump further comprises: a first holding capacitor having a first terminal and a second terminal, the first terminal coupled to the first output node; and a second holding capacitor having a third terminal and a fourth terminal, the third terminal coupled to the second output node, wherein the second DC voltage is further based on the first holding capacitor, and the third DC voltage is further based on the second holding capacitor. Additionally or alternatively to one or more of the examples disclosed above, in some examples, the first holding capacitor and the second holding capacitor have substantially the same capacitance. Additionally or alternatively to one or more of the examples disclosed above, in some examples, the second terminal of the first holding capacitor is coupled to a first reference DC voltage, and the fourth terminal of the second holding capacitor is coupled to: a second reference DC voltage during the first mode, and an AC voltage source during the second mode. Additionally or alternatively to one or more of the examples disclosed above, in some examples, the first reference DC voltage and the second reference DC voltage are ground voltages. Additionally or alternatively to one or more of the examples disclosed above, in some examples, the charge pump further comprises: switching circuitry coupled between: the fourth terminal of the second holding capacitor, and the second reference DC voltage and the AC voltage source, wherein during the first mode, the switching circuitry is configured to couple the fourth terminal of the second holding capacitor to the second reference DC voltage, and during the second mode, the switching circuitry is configured to couple the fourth terminal of the second holding capacitor to the AC voltage source. Additionally or alternatively to one or more of the examples disclosed above, in some examples, the first output node is configured to be coupled to a substrate on which the charge pump is formed. Additionally or alternatively to one or more of the examples disclosed above, in some examples, the second output node is configured to be coupled to the touch screen. Additionally or alternatively to one or more of the examples disclosed above, in some examples, the second output node is configured to be coupled to a gate line of a display pixel included in the touch screen. Additionally or alternatively to one or more of the examples disclosed above, in some examples, the second output node is further configured to be coupled to sense circuitry, the sense circuitry configured to sense touch at the display pixel.

Some examples of the disclosure are directed to a charge pump configured to operate in a first mode and a second mode, the charge pump comprising: means for transferring a first direct current (DC) voltage to a first node; means for coupling a first output node to the first node; and means for coupling a second output node to the first node, wherein: during the first mode, the first output node is configured to output a second DC voltage based on the first DC voltage, and the second output node is configured to output a third DC voltage based on the first DC voltage, and during the second mode, the first output node is configured to output the second DC voltage based on the first DC voltage, and the second output node is configured to output an alternating current (AC) voltage, the AC voltage being offset by the third DC voltage. Additionally or alternatively to one or more of the examples disclosed above, in some examples, the charge pump further comprises: means for coupling a first terminal of a first holding capacitor to the first output node, the first holding capacitor having the first terminal and a second terminal; means for coupling a third terminal of a second holding capacitor to the second output node, the second holding capacitor having the third terminal and a fourth terminal, wherein the second DC voltage is further based on the first holding capacitor, and the third DC voltage is further based on the second holding capacitor. Additionally or alternatively to one or more of the examples disclosed above, in some examples, the second terminal of the first holding capacitor is coupled to a first reference DC voltage, and the fourth terminal of the second holding capacitor is coupled to: a second reference DC voltage during the first mode, and an AC voltage source during the second mode. Additionally or alternatively to one or more of the examples disclosed above, in some examples, the charge pump further comprises: means for: during the first mode, coupling the fourth terminal of the second holding capacitor to the second reference DC voltage, and during the second mode, coupling the fourth terminal of the second holding capacitor to the AC voltage source. Additionally or alternatively to one or more of the examples disclosed above, in some examples, the charge pump further comprises: means for coupling the first output node to a substrate on which the charge pump is formed. Additionally or alternatively to one or more of the examples disclosed above, in some examples, the charge pump further comprises: means for coupling the second output node to a gate line of a display pixel included in a touch screen.

Some examples of the disclosure are directed to a method of operating a charge pump in a first mode and a second mode, the method comprising: transferring a first direct current (DC) voltage to a first node; coupling a first output node to the first node; and coupling a second output node to the first node, wherein: during the first mode, the first output node is configured to output a second DC voltage based on the first DC voltage, and the second output node is configured to output a third DC voltage based on the first DC voltage, and during the second mode, the first output node is configured to output the second DC voltage based on the first DC voltage, and the second output node is configured to output an alternating current (AC) voltage, the AC voltage being offset by the third DC voltage. Additionally or alternatively to one or more of the examples disclosed above, in some examples, the method further comprises: coupling a first terminal of a first holding capacitor to the first output node, the first holding capacitor having the first terminal and a second terminal; coupling a third terminal of a second holding capacitor to the second output node, the second holding capacitor having the third terminal and a fourth terminal, wherein the second DC voltage is further based on the first holding capacitor, and the third DC voltage is further based on the second holding capacitor. Additionally or alternatively to one or more of the examples disclosed above, in some examples, the method further comprises: coupling the second terminal of the first holding capacitor to a first reference DC voltage; during the first mode, coupling the fourth terminal of the second holding capacitor to a second reference DC voltage; and during the second mode, coupling the fourth terminal of the second holding capacitor to an AC voltage source. Additionally or alternatively to one or more of the examples disclosed above, in some examples, the method further comprises: coupling the first output node to a substrate on which the charge pump is formed. Additionally or alternatively to one or more of the examples disclosed above, in some examples, the method further comprises: coupling the second output node to a gate line of a display pixel included in a touch screen.

Although examples of this disclosure have been fully described with reference to the accompanying drawings, it is to be noted that various changes and modifications will become apparent to those skilled in the art. Such changes and modifications are to be understood as being included within the scope of examples of this disclosure as defined by the appended claims.

The invention claimed:

1. A charge pump configured to operate in a first mode and a second mode, the charge pump comprising:

a charging capacitor coupled to a first node and configured to transfer a first direct current (DC) voltage to the first node;
a first output node coupled to the first node; and
a second output node coupled to the first node,
wherein:
during the first mode, the first output node is configured to output a second DC voltage based on the first DC voltage, and the second output node is configured to output a third DC voltage based on the first DC voltage, and
during the second mode, the first output node is configured to output the second DC voltage based on the first DC voltage, and the second output node is configured to output an alternating current (AC) voltage, the AC voltage being offset by the third DC voltage.

2. The charge pump of claim 1, wherein:
the first output node is coupled to the first node via a first switch, and
the second output node is coupled to the first node via a second switch.

3. The charge pump of claim 2, wherein the first switch and the second switch are controlled by a single clock signal.

4. The charge pump of claim 2, wherein the first switch and the second switch are controlled by different clock signals.

5. The charge pump of claim 1, wherein the second DC voltage and the third DC voltage are the same.

6. The charge pump of claim 1, further comprising:
a first holding capacitor having a first terminal and a second terminal, the first terminal coupled to the first output node; and
a second holding capacitor having a third terminal and a fourth terminal, the third terminal coupled to the second output node,
wherein the second DC voltage is further based on the first holding capacitor, and the third DC voltage is further based on the second holding capacitor.

7. The charge pump of claim 6, wherein the first holding capacitor and the second holding capacitor have substantially the same capacitance.

8. The charge pump of claim 6, wherein:
the second terminal of the first holding capacitor is coupled to a first reference DC voltage, and
the fourth terminal of the second holding capacitor is coupled to:
a second reference DC voltage during the first mode, and
an AC voltage source during the second mode.

9. The charge pump of claim 8, wherein the first reference DC voltage and the second reference DC voltage are ground voltages.

10. The charge pump of claim 8, further comprising:
switching circuitry coupled between:
the fourth terminal of the second holding capacitor, and
the second reference DC voltage and the AC voltage source,
wherein during the first mode, the switching circuitry is configured to couple the fourth terminal of the second holding capacitor to the second reference DC voltage, and during the second mode, the switching circuitry is configured to couple the fourth terminal of the second holding capacitor to the AC voltage source.

11. The charge pump of claim 1, wherein the first output node is configured to be coupled to a substrate on which the charge pump is formed.

12. The charge pump of claim 1, wherein the second output node is configured to be coupled to the touch screen.

13. The charge pump of claim 12, wherein the second output node is configured to be coupled to a gate line of a display pixel included in the touch screen.

14. The charge pump of claim 13, wherein the second output node is further configured to be coupled to sense circuitry, the sense circuitry configured to sense touch at the display pixel.

15. A charge pump configured to operate in a first mode and a second mode, the charge pump comprising:
means for transferring a first direct current (DC) voltage to a first node;
means for coupling a first output node to the first node; and
means for coupling a second output node to the first node,
wherein:
during the first mode, the first output node is configured to output a second DC voltage based on the first DC voltage, and the second output node is configured to output a third DC voltage based on the first DC voltage, and
during the second mode, the first output node is configured to output the second DC voltage based on the first DC voltage, and the second output node is configured to output an alternating current (AC) voltage, the AC voltage being offset by the third DC voltage.

16. The charge pump of claim 15, further comprising:
means for coupling a first terminal of a first holding capacitor to the first output node, the first holding capacitor having the first terminal and a second terminal;
means for coupling a third terminal of a second holding capacitor to the second output node, the second holding capacitor having the third terminal and a fourth terminal,
wherein the second DC voltage is further based on the first holding capacitor, and the third DC voltage is further based on the second holding capacitor.

17. The charge pump of claim 16, wherein:
the second terminal of the first holding capacitor is coupled to a first reference DC voltage, and
the fourth terminal of the second holding capacitor is coupled to:
a second reference DC voltage during the first mode, and
an AC voltage source during the second mode.

18. The charge pump of claim 17, further comprising:
means for:
during the first mode, coupling the fourth terminal of the second holding capacitor to the second reference DC voltage, and
during the second mode, coupling the fourth terminal of the second holding capacitor to the AC voltage source.

19. The charge pump of claim 15, further comprising:
means for coupling the first output node to a substrate on which the charge pump is formed.

20. The charge pump of claim 15, further comprising:
means for coupling the second output node to a gate line of a display pixel included in a touch screen.

21. A method of operating a charge pump in a first mode and a second mode, the method comprising:
transferring a first direct current (DC) voltage to a first node;
coupling a first output node to the first node; and coupling a second output node to the first node,
wherein:
during the first mode, the first output node is configured to output a second DC voltage based on the first DC voltage, and the second output node is configured to output a third DC voltage based on the first DC voltage, and
during the second mode, the first output node is configured to output the second DC voltage based on the first DC voltage, and the second output node is configured to output an alternating current (AC) voltage, the AC voltage being offset by the third DC voltage.

22. The method of claim 21, further comprising:
coupling a first terminal of a first holding capacitor to the first output node, the first holding capacitor having the first terminal and a second terminal;
coupling a third terminal of a second holding capacitor to the second output node, the second holding capacitor having the third terminal and a fourth terminal, wherein the second DC voltage is further based on the first holding capacitor, and the third DC voltage is further based on the second holding capacitor.

23. The method of claim 22, further comprising:
coupling the second terminal of the first holding capacitor to a first reference DC voltage;
during the first mode, coupling the fourth terminal of the second holding capacitor to a second reference DC voltage; and
during the second mode, coupling the fourth terminal of the second holding capacitor to an AC voltage source.

24. The method of claim 21, further comprising:
coupling the first output node to a substrate on which the charge pump is formed.

25. The method of claim 21, further comprising:
coupling the second output node to a gate line of a display pixel included in a touch screen.

* * * * *